United States Patent [19]

Jun

[11] Patent Number: 5,326,998
[45] Date of Patent: Jul. 5, 1994

[54] SEMICONDUCTOR MEMORY CELL AND MANUFACTURING METHOD THEREOF

[75] Inventor: Young K. Jun, Seoul, Rep. of Korea

[73] Assignee: Goldstar Electron Co., Ltd., Cheongju, Rep. of Korea

[21] Appl. No.: 931,077

[22] Filed: Aug. 17, 1992

[30] Foreign Application Priority Data

Aug. 16, 1991 [KR] Rep. of Korea .................. 91-14124
Apr. 17, 1992 [KR] Rep. of Korea ................... 92-6494

[51] Int. Cl.$^5$ .................... H01L 29/68; H01L 21/265
[52] U.S. Cl. ................................. 257/306; 257/309; 257/534; 257/773; 257/926; 437/49; 437/60; 437/189; 437/919
[58] Field of Search ............... 257/306, 309, 534, 773, 257/926; 437/49, 60, 189, 919

[56] References Cited

U.S. PATENT DOCUMENTS

| 4,641,166 | 2/1987 | Takemae et al. | 357/23.6 |
|---|---|---|---|
| 4,649,406 | 3/1987 | Takemae et al. | 357/23.6 |
| 4,754,313 | 6/1988 | Takemae et al. | 357/41 |
| 4,764,479 | 8/1988 | Kosa | 257/306 |
| 4,953,126 | 8/1990 | Ema | 365/18.2 |
| 4,970,564 | 11/1990 | Kimura et al. | 357/23.6 |
| 4,974,040 | 11/1990 | Taguchi et al. | 357/23.6 |
| 5,014,103 | 5/1991 | Ema | 357/41 |
| 5,021,357 | 6/1991 | Taguchi et al. | 437/52 |

OTHER PUBLICATIONS

A new stacked Capacitor Dram Cell characterized by a storage capacitor on a bit-line structure by Kimura, Kawamoto, Kure, Hasegawa, Etoh, Aoki, Takeda, Sunami and Itoh–Central Research Laboratory, Hitachi Ltd. (IEDM 1988, pp. 596-599).

3-Dimensional stacked capacitor cell for 16M Drams by EMA, Kawanago, Nishi, Yoshida, Nishibe, Yabu, Kodama Nakano and Tagushi–Fugitsu Laboratories Limited (IEDM 1988, pp. 592-595).

Primary Examiner—Edward Wojciechowicz
Attorney, Agent, or Firm—Alan R. Loudermilk

[57] ABSTRACT

A semiconductor memory cell and device having a tubular formed storage electrode of a capacitor through which a bit line passes. The source, gate and drain of a switching transistor are arranged in a direction parallel to a longitudinal axis of the tubular storage electrode. An active region also is arranged in a parallel or superposing direction relative to the bit line and in a perpendicular direction relative to the word line. A manufacturing method thereof includes forming a switching transistor, forming a part of the capacitor storage electrode connected with the drain of the switching transistor, forming an oxide film side wall, forming a bit line in parallel to a longitudinal axis of the active region, forming a capacitor storage electrode of tubular form, covering the surface of the capacitor storage electrode with a capacitor dielectric film, and forming a plate electrode of the capacitor thereon.

17 Claims, 7 Drawing Sheets

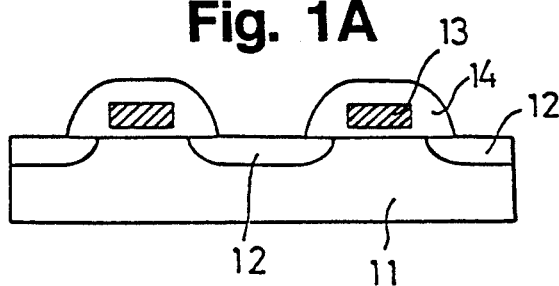
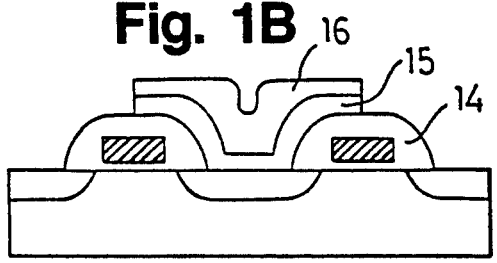
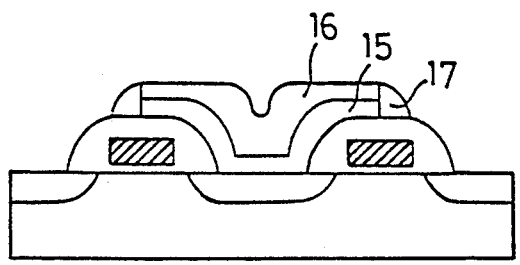
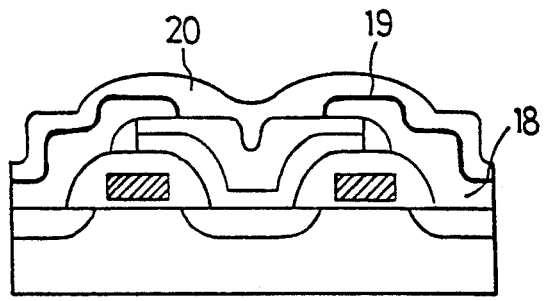
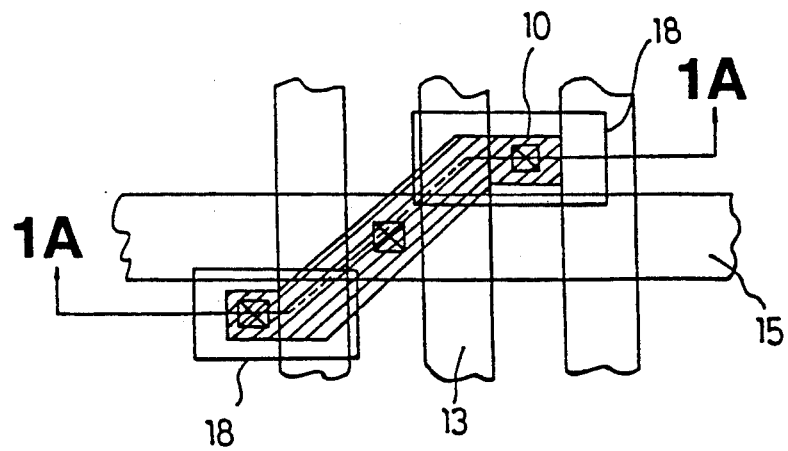

SEMICONDUCTOR MEMORY CELL AND MANUFACTURING METHOD THEREOF

BACKGROUND OF THE INVENTION

1. Field of the Invention

This invention relates to a semiconductor memory cell and manufacturing method thereof, and particularly to a semiconductor memory cell in which capacitor electrodes are formed like a tunnel, with a bit line passing through the interior thereof so that distortion of patterning is decreased while capacitance of the capacitor is increased.

2. Description of the Prior Art

A structure of a stacked capacitor cell (or "STC") and its manufacturing method are known in the art. Such a conventional cell has been described as a shielded bit line, and is formed with storage capacitors on bit lines. This type of conventional memory cell and manufacturing method and its layout, illustrated in FIG. 1, are considered a technique with some similarity to the present invention. One of these conventional STC cells is disclosed in U.S. Pat. No. 4,970,564, issued on Nov. 13, 1990 to Kimura et al.

FIG. 1(E) illustrates a small part of the layout of such a conventional STC cell. Active region 10, where elements are to be formed, is tilted at an angle of 45° with respect to the word line and the bit line that meet at a right angle with each other, enabling storage electrode 18 to be arranged very densely.

FIGS. 1(A) to (D) are cross sectional views taken along line 1A—1A of FIG. 1(E) that illustrate the steps of fabricating such a conventional STC cell.

Referring to FIG. 1(A), field and active regions are partitioned on semiconductor substrate 11, and then source and drain regions 12 and gate electrode 13 are formed. Gate electrode insulating oxide film 14 is deposited and a bit line contact is opened by a photolithographic process. Thereafter, as illustrated in FIG. 1(B), a refractory metal or polysilicon layer (used to form a bit line) and oxide film 16 are deposited, and then bit line 15 is formed by patterning the deposited layers by utilizing a photoresist film as a mask. Thereafter, the photoresist film is removed, resulting in the structure of FIG. 1(B).

Successively, as illustrated in FIG. 1(C), an oxide film is deposited and etched back without the photoresist film mask, and oxide side wall 17 is formed on bit line side walls, and a buried contact connecting the active region and a storage electrode are formed. As illustrated in FIG. 1(D), storage electrode 18, capacitor dielectric film 19 (an electrical insulator) and plate electrode 20 are formed in turn, and thereby a memory cell is produced.

The conventional memory cell manufactured by the method as described above, as illustrated in FIG. 1(E), is arranged such that bit line 15 and word line 13 intersect orthogonally with each other, and active region 10 is angled relative to bit line 15 and word line 13.

However, since bit line 15 is formed before the capacitor, a contact in the active region between the drain and the storage node (electrode) of the capacitor should be formed at a location over which the bit line does not pass. Accordingly, the active region should be disposed so as to be in a diagonal direction relative to the bit line and word line. Therefore, since the active region of the cell includes a tilted portion making an angle of 45° with respect to word line 13 and bit line 15, distortion occurs in the photolithographic process for patterning the active region. Thus, a difficulty exists with this process, and unit cell area is not decreased.

SUMMARY OF THE INVENTION

In order to solve such conventional problems, in the present invention a bit line is formed to pass through the storage electrode of the capacitor, and the active region, bit line, and capacitor are integrally superimposed. That is, in a memory cell comprising one switching transistor and one capacitor, the storage electrode of the capacitor surrounds the bit line, and active region is formed in a parallel or superposing direction relative to the bit line, and in a perpendicular direction relative to the word line.

Accordingly, it is an object of the present invention to provide a semiconductor memory cell connected to a bit line and a word line and having a switching transistor formed in an active region and a storage capacitor, with the storage electrode of the capacitor shaped in a tubular form that completely surrounds the bit line for a predetermined length.

Another object of the present invention is to provide a semiconductor memory cell in which the source, gate and drain of a switching transistor are arranged in the same direction as a longitudinal axis of the tube of the storage electrode of the capacitor.

A further object of the present invention is to provide a method comprising:

(1) a step for forming a switching transistor with a gate, source and drain in an active region, with the active region defined by a field oxide film that electrically isolates each of the active regions;

(2) a step for forming a part of a capacitor storage electrode connected to the drain of the switching transistor by depositing a first oxide film, opening a buried contact by a conventional photolithographic process, depositing a first polysilicon film on the overall surface, depositing a second oxide film, and patterning the second oxide film and the first polysilicon film perpendicular to the longitudinal axis (lengthwise direction) of the active region;

(3) a step for forming an oxide film side wall beside the first polysilicon film by depositing an oxide film on the overall surface of the wafer and etching back the oxide film;

(4) a step for forming a bit line by opening a bit line contact by a conventional photolithographic process, depositing a second polysilicon film, etching back the second polysilicon film only to an appropriate thickness, depositing a refractory metal film on the second polysilicon film, depositing a third oxide film, and thereafter patterning the third oxide film, the refractory metal film, and the second polysilicon film in parallel to a longitudinal axis of the active region;

(5) a step for depositing a fourth oxide film, and patterning the fourth oxide film and the second oxide film exposed on the surface by a photolithographic process in parallel to the longitudinal axis of the active region;

(6) a step for forming a capacitor storage electrode in tubular form by depositing a third polysilicon film, and patterning the third polysilicon film and the first polysilicon film by a photolithographic process; and (7) a step for covering the surface of the capacitor storage electrode with a capacitor dielectric film, and forming a plate electrode of the capacitor thereon.

Another object of the present invention is to provide a method for manufacturing a semiconductor memory cell comprising:

(1) a step for forming a switching transistor with a gate, source and drain in an active region, with the active region defined by a field oxide film that electrically isolates each of the active regions;

(2) a step for forming a part of a capacitor storage electrode connected to the drain of the switching transistor by depositing a first oxide film, opening a buried contact by a conventional photolithographic process, depositing a first polysilicon film on the overall surface, depositing a second oxide film, and patterning the second oxide film and the first polysilicon film perpendicular to the longitudinal axis (lengthwise direction) of the active region;

(3) a step for forming an oxide film side wall beside the first polysilicon film by depositing an oxide film on the overall surface of the wafer and etching back the oxide film;

(4) a step for forming a bit line by opening a bit line contact by a conventional photolithographic process, depositing a second polysilicon film, etching back the second polysilicon film only to an appropriate thickness, depositing a refractory metal film on the second polysilicon film, depositing a third oxide film, and thereafter patterning the third oxide film, refractory metal film and second polysilicon film in parallel to a longitudinal axis of the active region;

(5) a step for depositing a first isolation film made of a material with greater etching selectivity than the second oxide film, the first polysilicon film and a third polysilicon film (to be deposited), patterning the first isolation film to cover the bit line in a parallel manner, depositing a third polysilicon film and a second isolation film made of a material with greater etching selectivity than the second oxide film and first and third polysilicon films, and thereafter patterning the second isolation film so as to cover the bit line in a parallel manner by a photolithographic process;

(6) a step for etching the third polysilicon film, second oxide film, and the first polysilicon film in turn by using the second isolation film as a mask layer and thereby forming an upper portion of the capacitor storage electrode;

(7) a step for forming a storage electrode of the capacitor by depositing a fourth polysilicon film, dry etching the fourth polysilicon film and then removing the second isolation film with a wet etching process, thereby forming a side wall projection connecting the third polysilicon film above the bit line and the first polysilicon film under the bit line; and (8) a step for forming a dielectric film of the capacitor and a plate electrode of the capacitor on the surface of the storage electrode of the capacitor.

Preferably, the first and second isolation films are nitride films.

BRIEF DESCRIPTION OF THE DRAWINGS

The above-mentioned features and objects of the present invention will become more apparent by reference to the following description taken in conjunction with the accompanying drawings, in which:

FIG. 1(A) to (E) are sectional views and a layout view illustrating a conventional memory cell;

DESCRIPTION OF THE PREFERRED EMBODIMENTS

Hereinafter preferred embodiments of the present invention will be described with reference to the drawings of FIGS. 2, 3 and 4.

Figure 2:
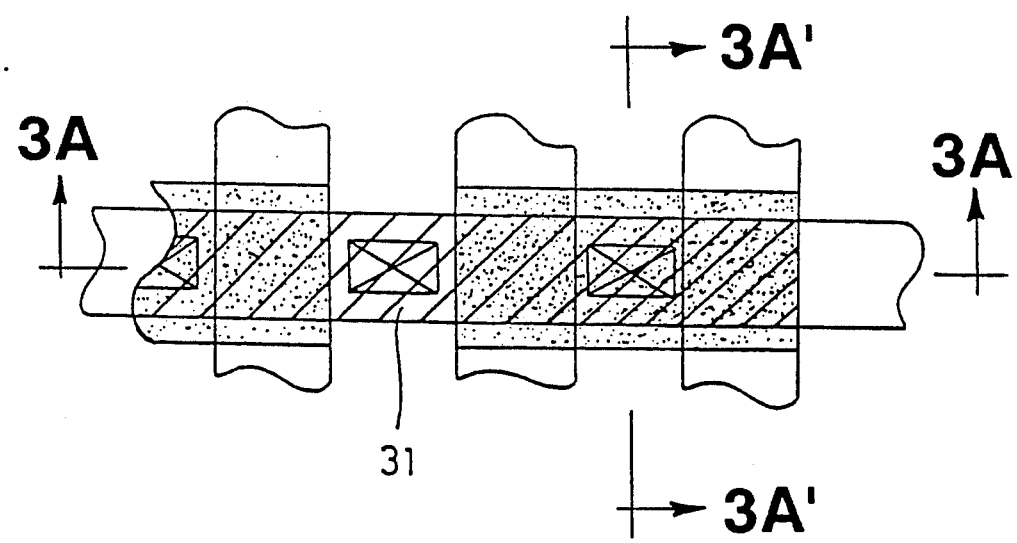
FIG. 2 is a layout view of a memory cell in accordance with the present invention.

FIG. 2 is a schematically shown layout of the present invention. FIG. 3(A) to (H) and FIG. 4(E) to (I) are cross sectional views taken along line 3A—3A of FIG. 2. FIG. 3(A') to (H') and FIG. 4 (E') to (I') are cross sectional views taken along line 3A'-3A' of FIG. 2.

The first embodiment of the present invention now will be described in detail.

Figure 3A:
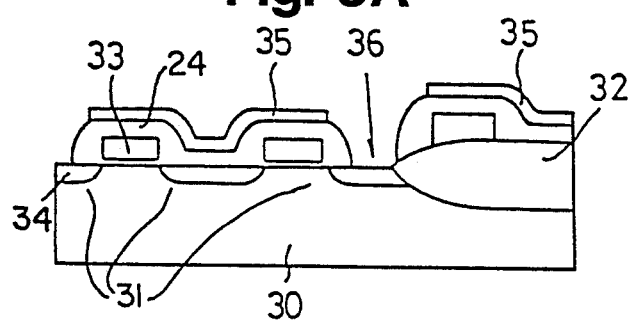
FIG. 3 (A)(A') to (H)(H') are cross sectional views for illustrating a first embodiment of a manufacturing method of a semiconductor memory cell in accordance with the present invention.
Figure 3A:
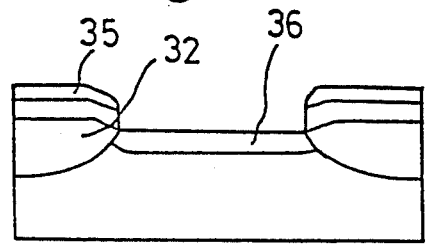

As illustrated in FIG. 3(A) and (A'), active region 31 (shown in FIG. 2) and field oxide film 32, which provides element isolating regions, are formed on silicon substrate 30. Gate 33, gate insulating layers 24 and source and drain regions 34 are formed as illustrated so that a switching transistor is formed.

Thereafter, first oxide film 35 is deposited and buried contact 36 is opened.

Figure 3B:
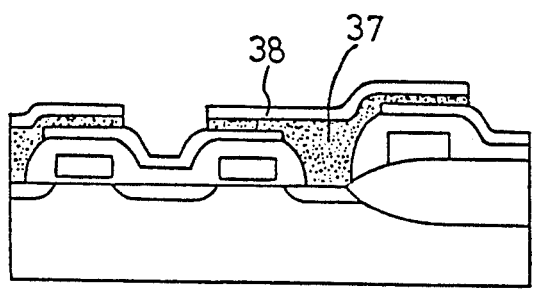
Figure 3B:
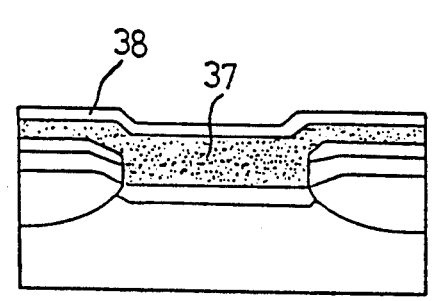

Next, as illustrated in FIG. 3(B) and (B'), first polysilicon film 37 is deposited as a doped polysilicon or amorphous silicon layer (hereinafter referred to as polysilicon film 37), and then second oxide film 38 is deposited. Second oxide film 38 and first polysilicon film 37 are patterned in a direction in parallel to line 3A'—3A' (a direction perpendicular to a lengthwise direction of the active region). Thus, a part of a capacitor storage electrode connected with the drain of the switching transistor is formed.

Figure 3C:
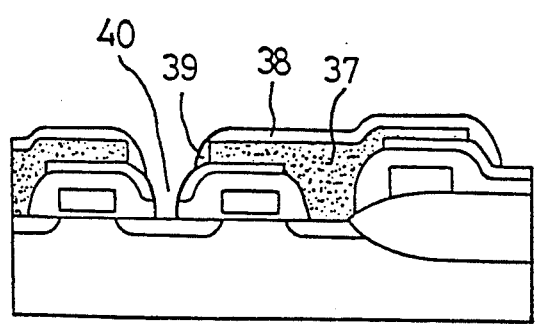
Figure 3C:
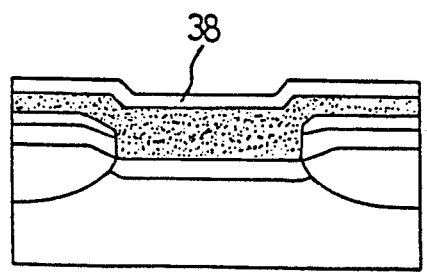

Thereafter, as illustrated in FIG. 3(C) and (C'), oxide film side wall 39 is formed beside first polysilicon film 37 by a process in which an oxide film is deposited on the overall surface and etched back to remain as a side wall oxide film. Bit line contact 40 is opened by a photolithographic process.

Figure 3D:
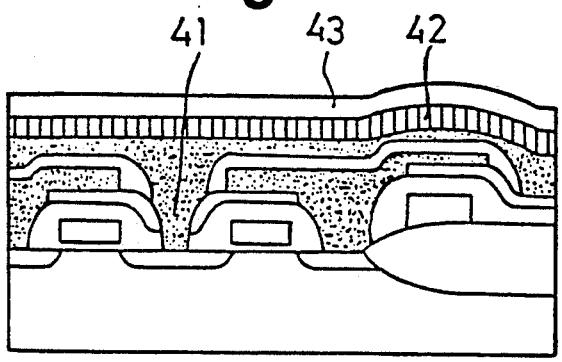
Figure 3D:
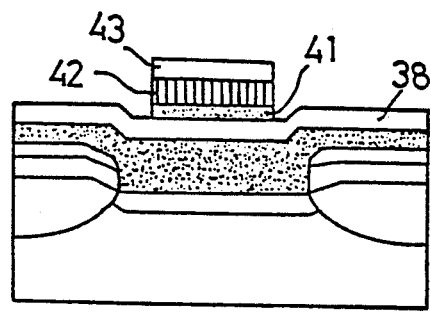
Figure 3E:
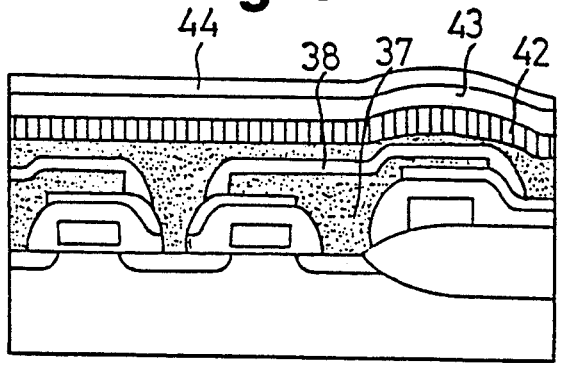
Figure 3E:
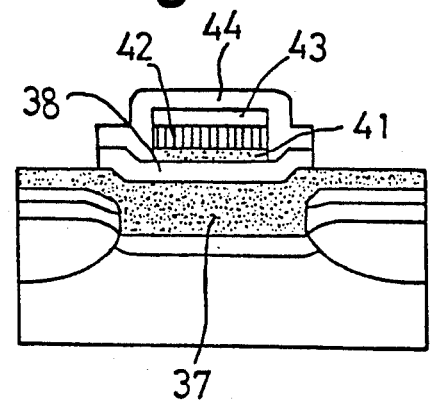
Figure 3F:
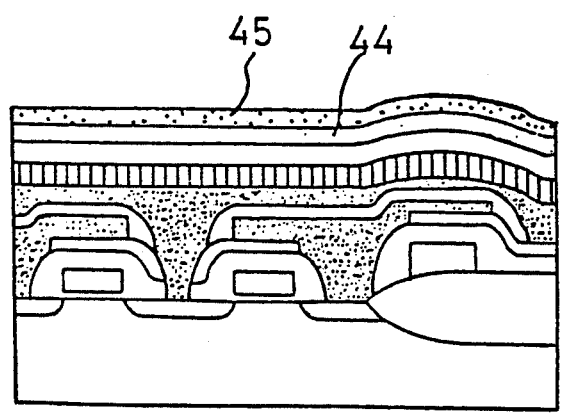
Figure 3F:
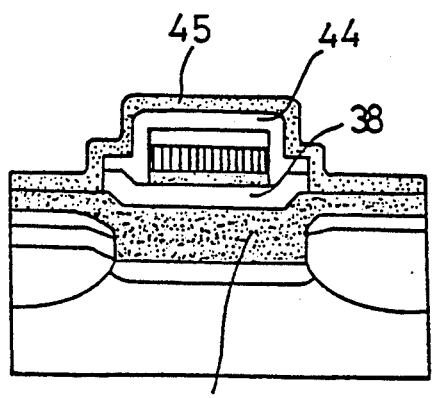
Figure 3G:
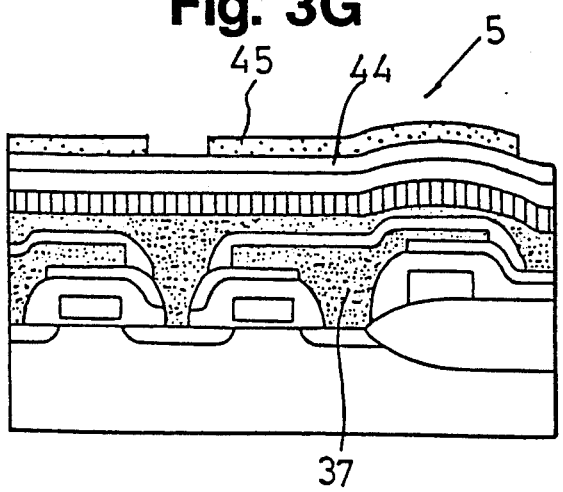
Figure 3G:
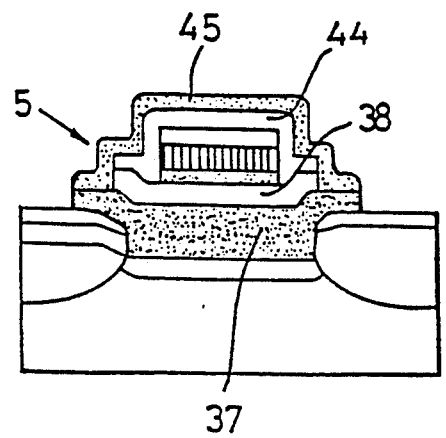
Figure 3H:
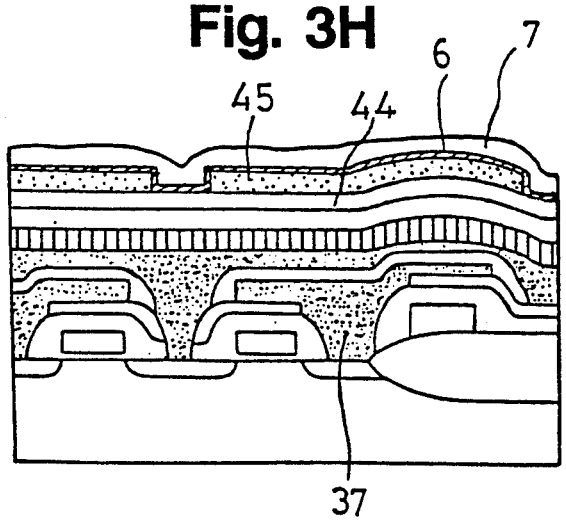
Figure 3H:
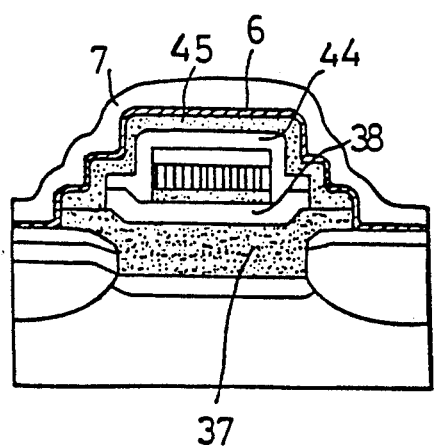

Successively, as illustrated in FIG. 3(D) and (D'), second polysilicon film 41 is deposited and etched back only to an appropriate thickness without a photoresist mask. Then refractory (high melting point) metal film 42 is deposited, and third oxide film 43 is deposited and thereafter the bit line is patterned in parallel to line 3A—3A of FIG. 2. Thus, a part of second oxide film 38 is exposed.

Thereafter, as illustrated in FIG. 3 (E) and (E'), fourth oxide film 44 is deposited. Fourth oxide film 44 and second oxide film 38 are patterned by a photolithographic process in a direction parallel to line 3A—3A. Thus, a part of first polysilicon film 37 is exposed.

Thereafter, as illustrated in FIG. 3 (F) and (F'), third polysilicon film 45 is deposited. As illustrated in FIG. 3(G) and (G'), third polysilicon film 45 and first polysilicon film 37 are patterned by a photolithographic process, and capacitor storage electrode 5 of tubular form is formed as shown.

Successively, as illustrated in FIG. 3 (H) and (H'), capacitor dielectric film 6 and plate electrode 7 are formed in turn so that a capacitor of a memory cell is formed.

Thus, when a memory cell is made in accordance with the present invention, since the active region is formed in a parallel or superposing direction relative to the bit line and in a perpendicular direction relative to the word line, an active region with a portion thereof having an inclined angle with respect to the word line or bit line is not present. Since a memory cell in accordance with the present invention has a structure in the form of a straight line, distortion does not occur upon patterning, and the unit cell area can be decreased.

A second embodiment of the present invention now will be described in detail with reference to FIG. 4 (E) to (I').

The processes of FIG. 3(A) and (A') to FIG. 3(D) and (D') explained with reference to the first embodiment of the present invention are executed in the second embodiment of the present invention and will not be described again here.

Figure 4E:
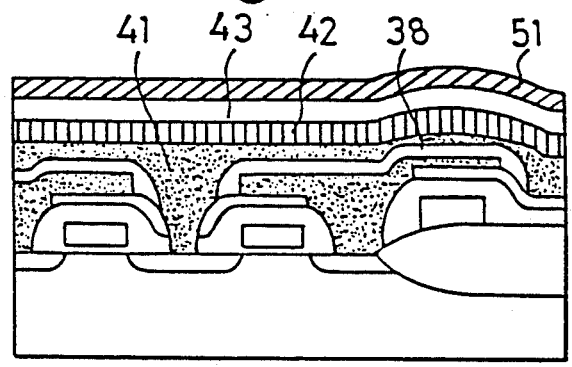
FIG. 4 (E)(E') to (I)(I') are cross sectional views for illustrating a second embodiment of a manufacturing method of a semiconductor memory cell in accordance with the present invention.
Figure 4E:
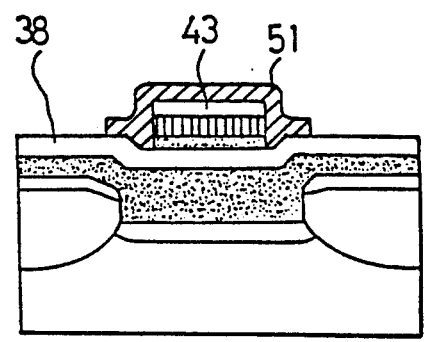

Successively thereafter, as illustrated in FIG. 4(E) and (E'), first nitride film 51 as an isolating material is deposited in order to protect third oxide film 43 during subsequent etching of second oxide film 38. First nitride film 51 is patterned so as to cover the bit lines formed by second polysilicon film 41 and refractory metal film 42 in a parallel manner. Thus, a part of second oxide film 38 is exposed.

Figure 4F:
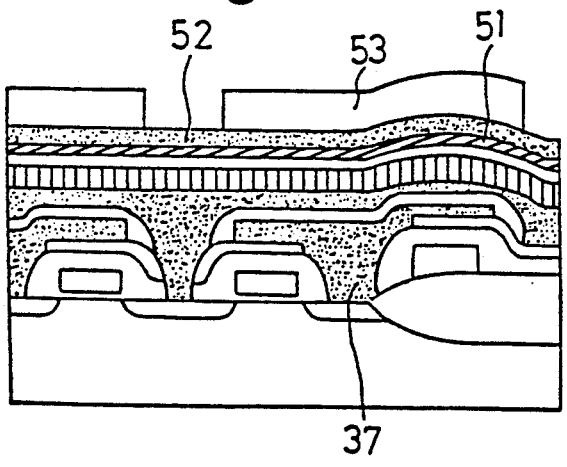
Figure 4F:
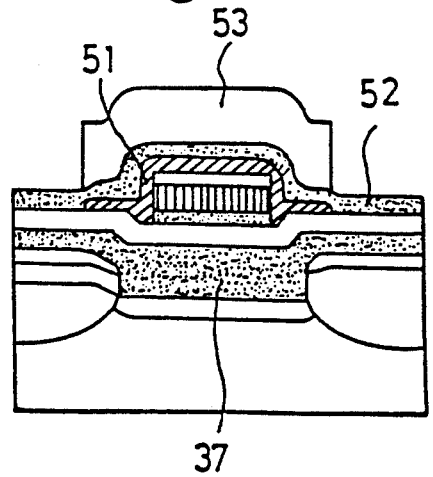
Figure 4G:
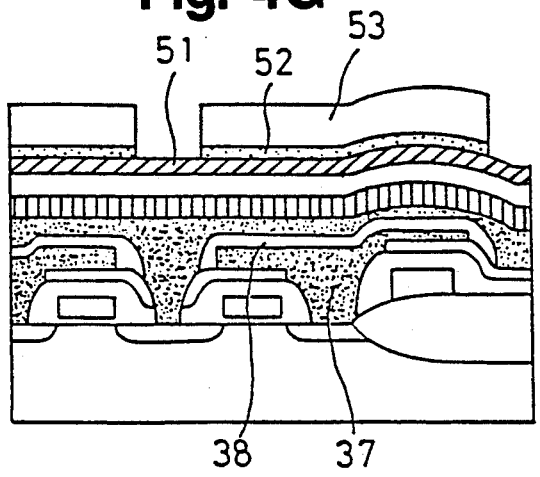
Figure 4G:
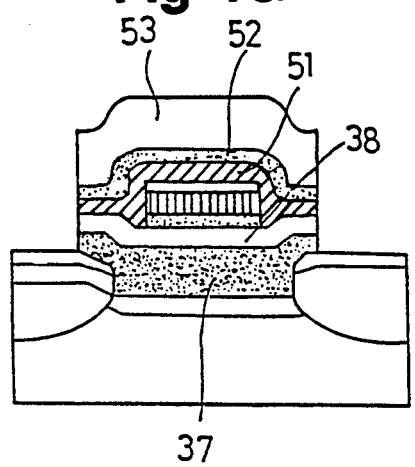

As illustrated in FIG. 4(F) and (F'), third polysilicon film 52 is deposited and second nitride film 53 as an isolating material also is deposited. Thereafter second nitride film 53 is patterned by a photolithographic process as illustrated. Thereafter, as illustrated in FIG. 4(G) and (G'), third polysilicon film 52, second oxide film 38, and first polysilicon film 37 are etched in turn by using second nitride film 53 as a mask layer.

Figure 4H:
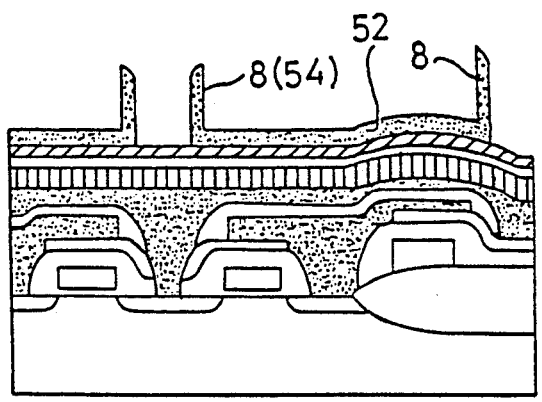
Figure 4H:
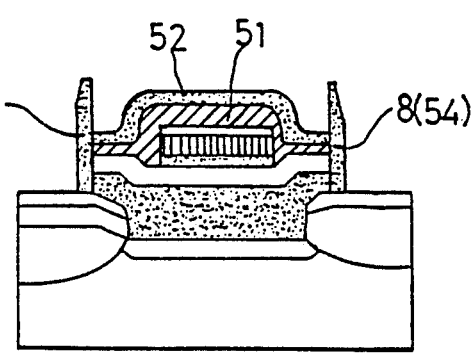

Successively, as illustrated in FIG. 4(H) and (H'), fourth polysilicon film 54 is deposited and side wall projection connecting portions 8 of capacitor storage electrodes are formed by dry etching fourth polysilicon film 54 as shown. Thereafter, second nitride film 53 is removed by a wet etching process. Side wall projection connecting portion 8 serves to connect third polysilicon film 52 above the bit line and first polysilicon film 37 under the bit line, and to simultaneously increase the surface area of the storage electrode, thereby increasing the capacity of the capacitor.

Figure 4I:
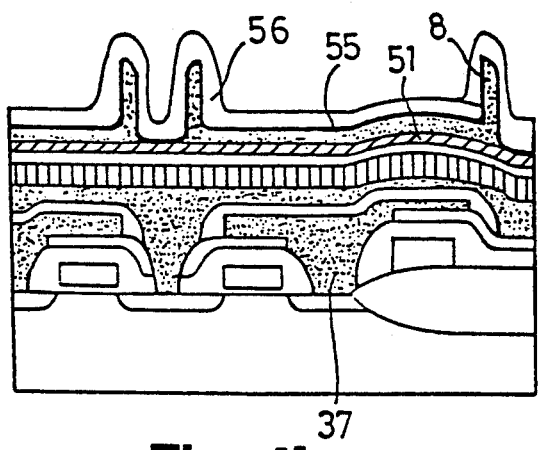
Figure 4I:
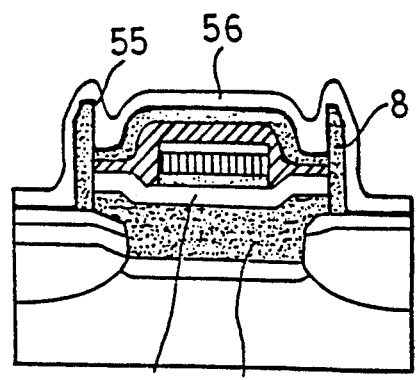

Subsequently, as illustrated in FIG. 4(I) and (I'), dielectric film 55 of the capacitor and plate electrode 56 of the capacitor are formed, and thereby the manufacturing of the capacitor in accordance with this embodiment of the present invention is completed.

In the process of the present invention beginning with the structure illustrated in FIG. 4(F), it is possible to utilize another isolating material with greater etching selectivity against the polysilicon in place of second nitride film 53.

When constructing a memory cell in accordance with this alternative embodiment, since the active region is formed in a parallel or superposing direction relative to the bit line and in a perpendicular direction relative to the word line, an active region with a portion thereof having an inclined angle to the word line or bit line of the unit cell is not present. Since the active region has a structure in the form of a straight line, no distortion occurs upon patterning. The capacitor and unit cell area can be decreased, and the capacitance can be increased without increasing the unit cell area.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device, comprising:
a plurality of switching transistors each having a gate and source and drain regions formed in an active region of a semiconductor substrate;
word lines coupled to the gates of the switching transistors through an insulating layer;
bit lines coupled to the source regions of the switching transistors;
tubular storage electrodes coupled to the drain regions of the switching transistors, each tubular storage electrode having an interior region, wherein a bit line passes through the interior regions of the tubular storage electrodes;
a dielectric layer on the tubular storage electrodes; and
a plate electrode on the dielectric layer.

2. The semiconductor memory device as claimed in claim 1, wherein the gate and source and drain regions of each switching transistor are linearly arranged in a first direction, wherein a bit line linearly passes through the interior region of one or more tubular storage electrodes in a second direction, wherein the first direction is substantially parallel to the second direction.

3. The semiconductor memory device as claimed in claim 2, wherein tubular storage electrodes are positioned substantially above at least a portion of the switching transistors.

4. The semiconductor memory device as claimed in claim 2, wherein the word lines are positioned substantially perpendicular to the first and second directions.

5. The semiconductor memory device as claimed in claim 1, wherein at least a portion of each active region is linearly arranged in a first direction, wherein a bit line linearly passes through the interior region of one or more tubular storage electrodes in a second direction, wherein the first direction is substantially parallel to the second direction.

6. The semiconductor memory device as claimed in claim 5, wherein tubular storage electrodes are positioned substantially above at least a portion of the linearly arranged portions of the active regions.

7. The semiconductor memory device as claimed in claim 5, wherein the word lines are positioned substantially perpendicular to the first and second directions.

8. In a semiconductor memory device having a switching transistor formed in an active region, a word line and a bit line, an improved storage capacitor comprising:
a tubular storage electrode having an interior region, wherein the bit line passes through the interior region of the tubular storage electrode;
a dielectric layer on the tubular storage electrode; and
a plate electrode on the dielectric layer.

9. The improved storage capacitor as claimed in claim 8, wherein at least a portion of the tubular storage electrode is positioned substantially above at least a portion of the switching transistor.

10. The improved storage capacitor as claimed in claim 8, wherein the bit line passing through the interior region of the tubular storage electrode is positioned substantially perpendicular to the word line.

11. An improved cell for a semiconductor memory, comprising:
   an active region including first and second diffusions of a switching transistor formed in a semiconductor substrate;
   an insulating layer formed on the semiconductor substrate and having first and second contact holes;
   a word line electrically isolated from the semiconductor substrate including a portion thereof formed as a gate electrode of the switching transistor;
   a tubular storage electrode having an interior region, the tubular storage electrode being electrically coupled through the first contact hole to the first diffusion;
   a bit line electrically coupled to the second diffusion through the second contact hole, wherein the bit line passes through the interior region of the tubular storage electrode;
   a dielectric layer on the tubular storage electrode; and
   a plate electrode on the dielectric layer.

12. The cell as claimed in claim 11, wherein the first and second diffusions of the switching transistor are linearly arranged in a first direction, wherein the bit line linearly passes through the interior region of the tubular storage electrode in a second direction, wherein the first direction is substantially parallel to the second direction.

13. The cell as claimed in claim 11, wherein the tubular storage electrode is positioned substantially above at least a portion of the switching transistor.

14. The cell as claimed in claim 11, wherein the word line is positioned substantially perpendicular to the first and second directions.

15. A method for manufacturing a semiconductor memory cell comprising:
   (1) forming a switching transistor with a gate, source and drain in an active region in a semiconductor substrate, with the active region defined by a field oxide film that electrically isolates each active region;
   (2) forming a first element of a capacitor storage electrode connected to the drain of the switching transistor by depositing a first oxide film, opening a buried contact in the first oxide film, depositing a first polysilicon film on the overall surface, depositing a second oxide film, and patterning the second oxide film and the first polysilicon film perpendicular to the longitudinal axis of the active region;
   (3) forming an oxide film side wall beside the first polysilicon film by depositing an oxide film on the overall surface and etching back the oxide film;
   (4) forming a bit line by opening a bit line contact, depositing a second polysilicon film, etching back the second polysilicon film, depositing a refractory metal film on the second polysilicon film, depositing a third oxide film, and patterning the third oxide film, the refractory metal film, and the second polysilicon film parallel to the longitudinal axis of the active region;
   (5) depositing a fourth oxide film, and patterning the fourth oxide film and the second oxide film parallel to the longitudinal axis of the active region to expose portions of the first polysilicon film;
   (6) forming a capacitor storage electrode in tubular form by depositing a third polysilicon film, and patterning the third polysilicon film and the first polysilicon film, wherein the capacitor storage electrode is formed by the remaining portions of the first and third polysilicon films; and
   (7) covering the surface of the capacitor storage electrode with a capacitor dielectric film, and forming a plate electrode of the capacitor thereon.

16. A method for manufacturing a semiconductor memory cell comprising:
   (1) forming a switching transistor with a gate, source and drain in an active region in a semiconductor substrate, with the active region defined by a field oxide film that electrically isolates the active region;
   (2) forming a first element of a capacitor storage electrode connected to the drain of the switching transistor by depositing a first oxide film, opening a buried contact in the first oxide film, depositing a first polysilicon film on the overall surface, depositing a second oxide film, and patterning the second oxide film and the first polysilicon film perpendicular to the longitudinal axis of the active region;
   (3) forming an oxide film side wall beside the first polysilicon film by depositing an oxide film on the overall surface and etching back the oxide film;
   (4) forming a bit line by opening a bit line contact, depositing a second polysilicon film, etching back the second polysilicon film, depositing a refractory metal film on the second polysilicon film, depositing a third oxide film, and patterning the third oxide film, the refractory metal film, and the second polysilicon film parallel to the longitudinal axis of the active region;
   (5) depositing a first isolation film of a material with greater etching selectivity than the second oxide film, the first polysilicon film and a third polysilicon film, patterning the first isolation film to cover the bit line in a parallel manner, depositing the third polysilicon film and a second isolation film of a material with greater etching selectivity than the second oxide film and the first and third polysilicon films, and patterning the second isolation film so as to cover the bit line in a parallel manner;
   (6) etching the third polysilicon film, the second oxide film, and the first polysilicon film in turn by using the second isolation film as a mask layer and thereby forming an upper element of the capacitor storage electrode;
   (7) forming a storage electrode of the capacitor by depositing a fourth polysilicon film, dry etching the fourth polysilicon film and then removing the second isolation film, thereby forming a side wall projection connecting the third polysilicon film above the bit line and the first polysilicon film under the bit line; and
   (8) forming a dielectric film of the capacitor and a plate electrode of the capacitor on the surface of the storage electrode of the capacitor.

17. A method for manufacturing a semiconductor memory cell as claimed in claim 5, characterized in that the first and second isolation films in the fifth step comprise nitride.

* * * * *